United States Patent
Dietz et al.

(10) Patent No.: US 7,305,594 B2
(45) Date of Patent: Dec. 4, 2007

(54) INTEGRATED CIRCUIT IN A MAXIMUM INPUT/OUTPUT CONFIGURATION

(75) Inventors: James J. Dietz, Durham, NC (US); David SuitWai Ma, Cary, NC (US)

(73) Assignee: Infineon Technologies AG, Munich (DE)

( * ) Notice: Subject to any disclaimer, the term of this patent is extended or adjusted under 35 U.S.C. 154(b) by 648 days.

(21) Appl. No.: 10/303,179

(22) Filed: Nov. 25, 2002

(65) Prior Publication Data

US 2004/0103346 A1  May 27, 2004

(51) Int. Cl.
*G11C 29/30* (2006.01)
*G11C 29/40* (2006.01)

(52) U.S. Cl. .................... 714/718; 714/763
(58) Field of Classification Search ........... 714/718, 714/724, 734, 743, 763; 365/200, 201; 324/754
See application file for complete search history.

(56) References Cited

U.S. PATENT DOCUMENTS

| | | | |
|---|---|---|---|
| 5,594,694 A * | 1/1997 | Roohparvar et al. | 365/201 |
| 5,924,124 A * | 7/1999 | Roy et al. | 711/163 |
| 6,064,213 A * | 5/2000 | Khandros et al. | 324/754 |
| 6,115,321 A * | 9/2000 | Koelling et al. | 365/233 |
| 6,215,689 B1 * | 4/2001 | Chhor et al. | 365/63 |
| 6,349,392 B1 * | 2/2002 | Swoboda et al. | 714/30 |
| 6,418,545 B1 * | 7/2002 | Adusumilli | 714/729 |
| 6,543,286 B2 * | 4/2003 | Garverick et al. | 73/514.18 |
| 6,727,722 B2 * | 4/2004 | Whetsel | 324/765 |
| 2003/0235929 A1 * | 12/2003 | Cowles et al. | 438/17 |

* cited by examiner

*Primary Examiner*—Cynthia Britt
*Assistant Examiner*—Dipakkumar Gandhi
(74) *Attorney, Agent, or Firm*—Brinks Hofer Gilson & Lione

(57) ABSTRACT

A memory includes input/output paths and electrical leads. Each of the input/output paths are coupled to separate electrical leads. The memory is configured to operate in a test architecture and an operating architecture. In the test architecture, logic enables a greatest number of input/output paths. In the operating architecture, the memory enables the same or fewer input/output paths. The method of selecting a configuration includes establishing an operating and a test architecture and testing the memory in its greater input/output configuration.

22 Claims, 4 Drawing Sheets

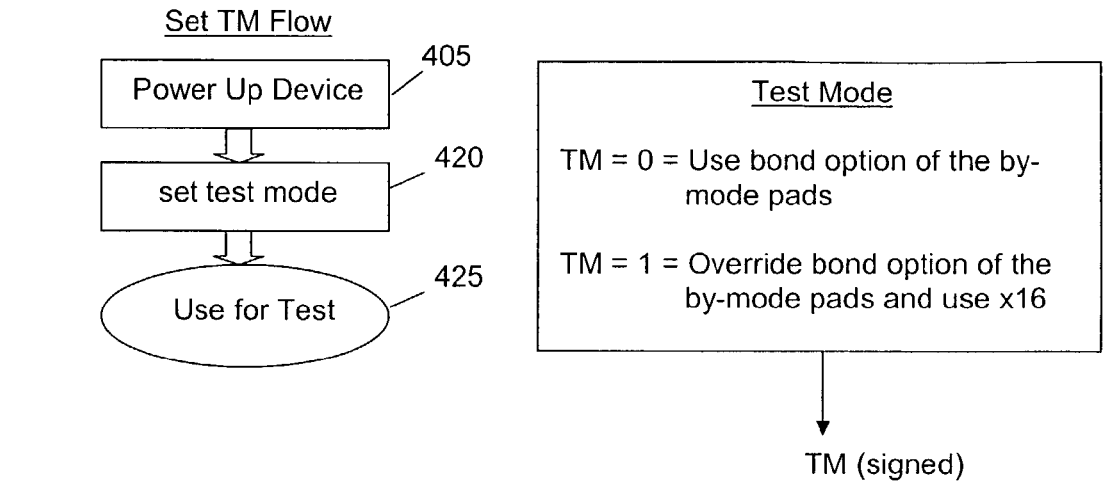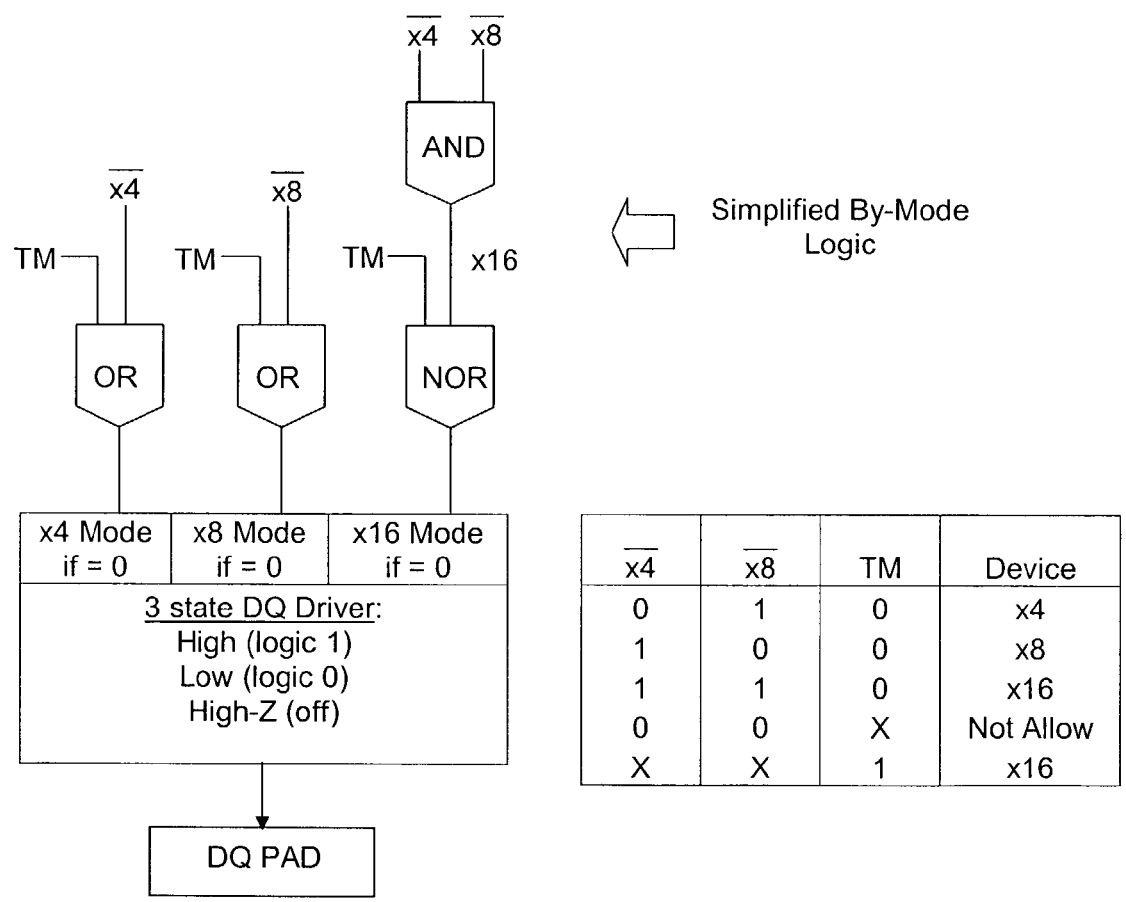
FIG.4

INTEGRATED CIRCUIT IN A MAXIMUM INPUT/OUTPUT CONFIGURATION

FIELD OF THE INVENTION

This invention relates to memory circuits, and more particularly, to integrated memory circuits.

BACKGROUND

Integrated circuits are small electronic circuits used to perform specific functions, such as storing instructions and data. Electronic circuits fabricated in silicon are interconnected by thin conducting materials, which are insulated from other circuits. Some chips are assembled into packages having leads that facilitate their connections to other devices.

Integrated memories can have many configurations. Possible memory configurations include a 16M×4, an 8M×8, a 14M×16, etc. In a ×4 ('by four') configuration, four input/output pins are wired to four external electrical leads. In a ×8 ('by eight') configuration, eight input/output pins are wired to eight external leads. These configurations can determine the performance, speed, and test times of a memory.

The speed of a by eight memory generally can be tested faster than a by four memory. The four additional input/output lines of the by eight configuration enables storage cells to be accessed faster than its by four counter part. Differences in test times can require customized test designs. Because test times are closely tied to production volume and because integrated memories can have many configurations, it can be difficult to process varieties of integrated memories cost effectively.

BRIEF DESCRIPTIONS OF DRAWINGS

In the figures, like reference numbers designate similar parts throughout different views.

FIG. 4 is a flow diagram and tables of the preferred test process of FIG. 2.

SUMMARY

The present invention is directed to a memory and method of selecting an operating and a test configuration. The presently preferred memory includes bonding pads and external leads. Each bonding pad is coupled to an external lead regardless of the operating architecture of the memory. The memory is configured to switch from an operating architecture to a test architecture.

A presently preferred method configures the memory into an operating and a test architecture. When in a test mode, the test architecture enables the widest input/output paths of the memory to be accessible.

DETAILED DESCRIPTION OF THE PRESENTLY PREFERRED EMBODIMENTS

Many integrated memories are geometrically and electrically customized to their semi-conductor applications. Their architectures determine the speeds at which they can be tested. In many cases, the number of input and output paths within an integrated memory determines the speed of a test. A common test application that verifies the interconnections between these input and output paths and the storage cells can often be run faster when the number of access paths are increased. The preferred system and method provides a standardized architecture that reduces the test times of integrated memories by testing these memories in their widest input/output configurations.

Figure 1:
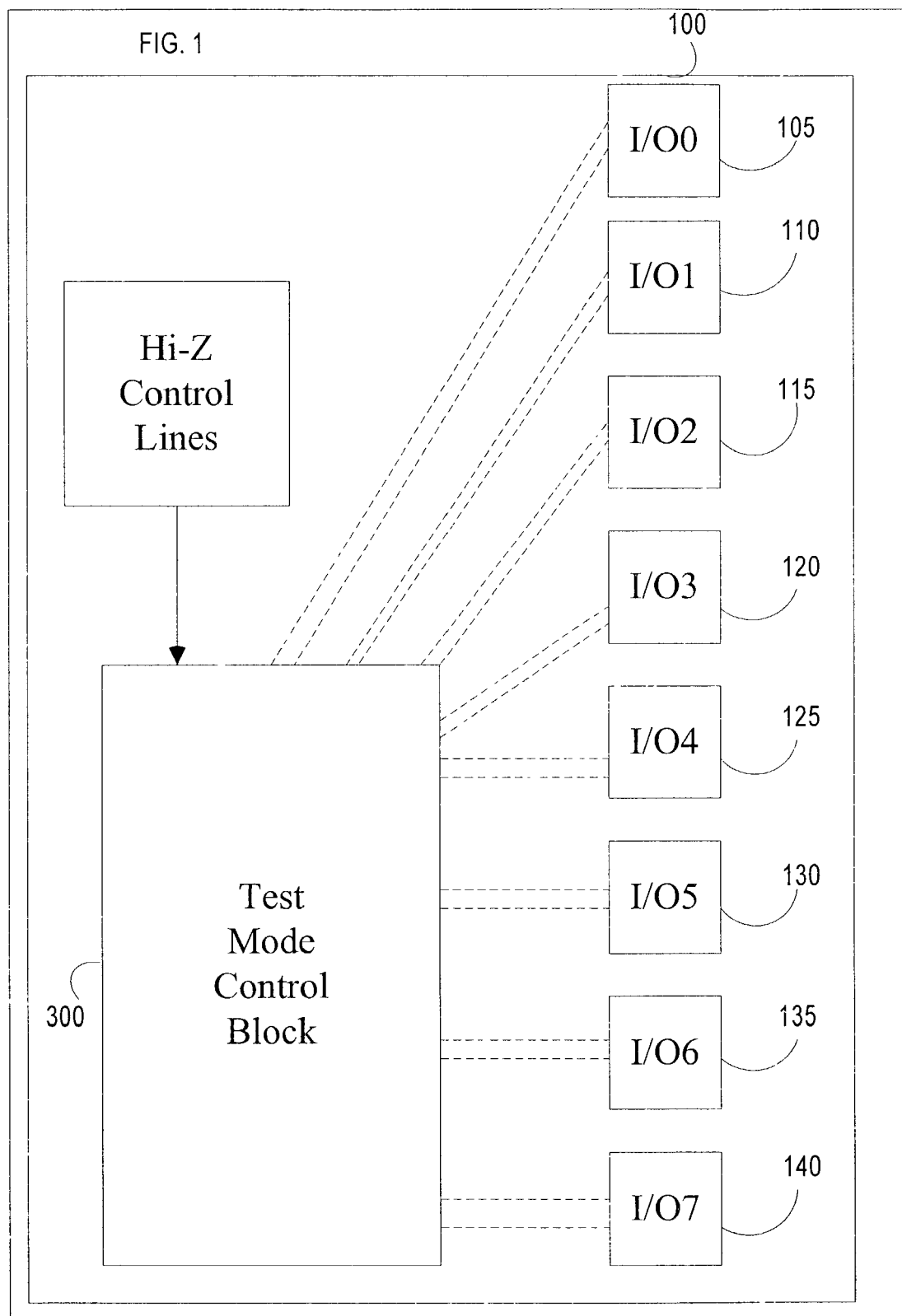
FIG. 1 is a block diagram of a preferred memory.

FIG. 1 is a block diagram of a presently preferred memory 100 illustrated in a by-four configuration. As shown, each electrical lead 105-140 is coupled to a test mode control block 300. The presently preferred by four-memory 100 has each of its internal input/output paths coupled to the external electrical leads of a memory package. In a test mode, each of the electrical leads 105-140 is used to verify interconnections and/or detect process defects within the storage cells that are resident to the memory 100. During normal operation, only four electrical leads I/00-I/03 105-120 are read from and/or written to by other hardware or software. During normal operation, the unused input/output paths illustrated as I/O4-I/O7 125-140 are driven to a high impedance ('Hi-Z') state.

Figure 2:
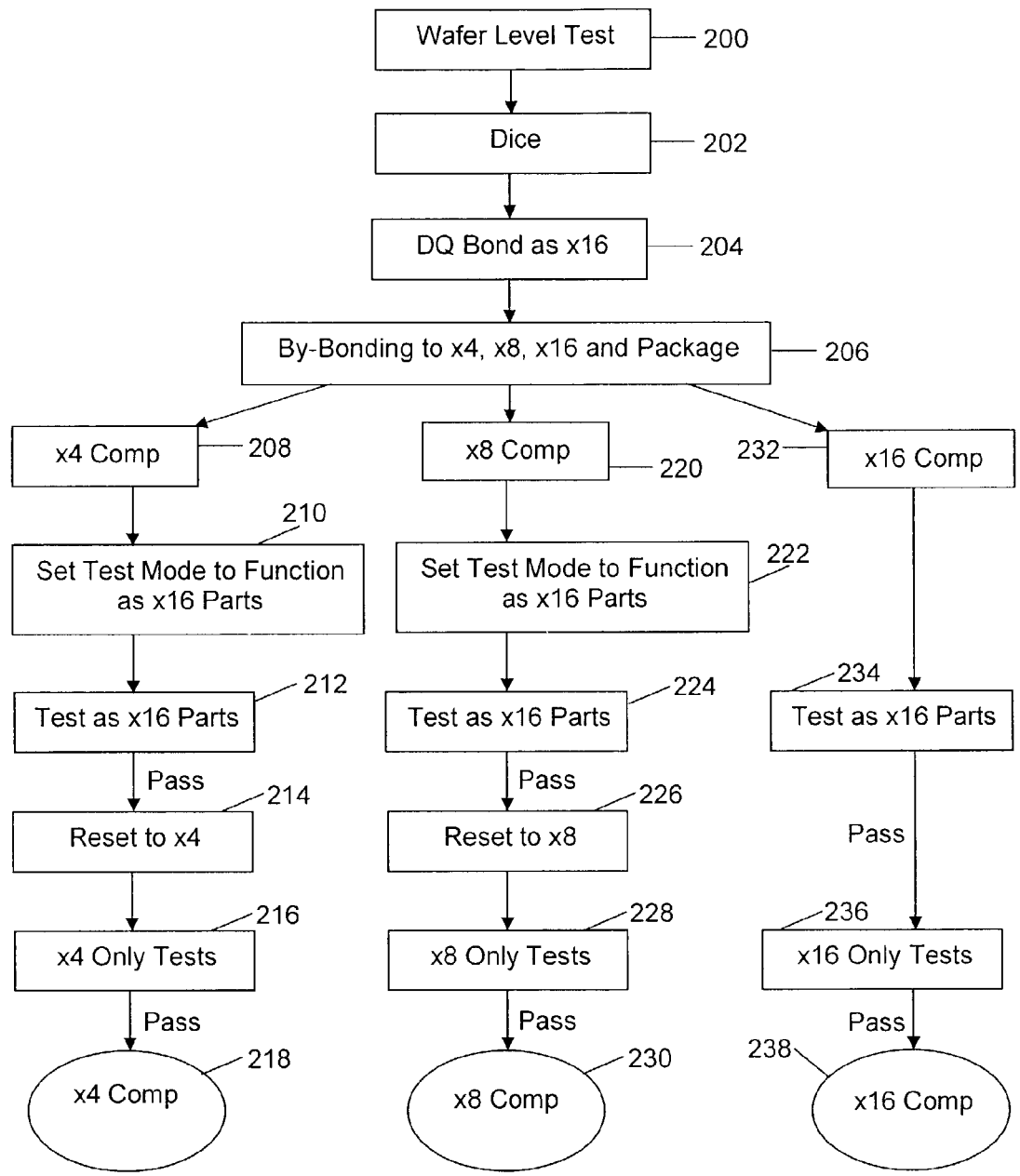
FIG. 2 is a flow diagram of a preferred testing process of FIG. 1.

FIG. 2 illustrates a flow diagram of a preferred testing process. The process begins with a wafer level test 200 followed by a dicing of the wafer in preparation of its bonding. Preferably, the wafer is separated into individual die by sawing or scribe-and-break techniques, although other types of die separation are used in alternative preferred embodiments. After an inspection and a sort, each of the input/output paths are bonded to the internal leads of the wafer at 204. Preferably, a conducting layer attaches the die to the internal leads.

At 206, thin wires are bonded to the wafer bonding pads and the inner electrical leads of the package. While bonding can occur by any means or processes, in this presently preferred embodiment a by-bonding process is used. When the bonding process is completed, the wafer is inspected and sorted. Preferably, the wafer is sorted into a by four, a by eight, or a by sixteen compliment as shown at 208, 220, and 232. Once sorted, the tester is programmed to test a by sixteen configuration at 210 and 222 and each of the wafers are tested at 212, 224, and 234. Preferably common test logic is used to evaluate each of the wafers at these acts. If the test requirements are met, the by four and by eight wafers are programmed or reset to their desired configurations at 214 and 226. Final tests are then performed on the wafer in its operating architectures at 216, 228, and 236. Preferably, the tests comprise parametric tests that assure performance and functional tests that assure memory functions, which in this preferred embodiment includes exercising data storage and retrieval capabilities.

Figure 3:
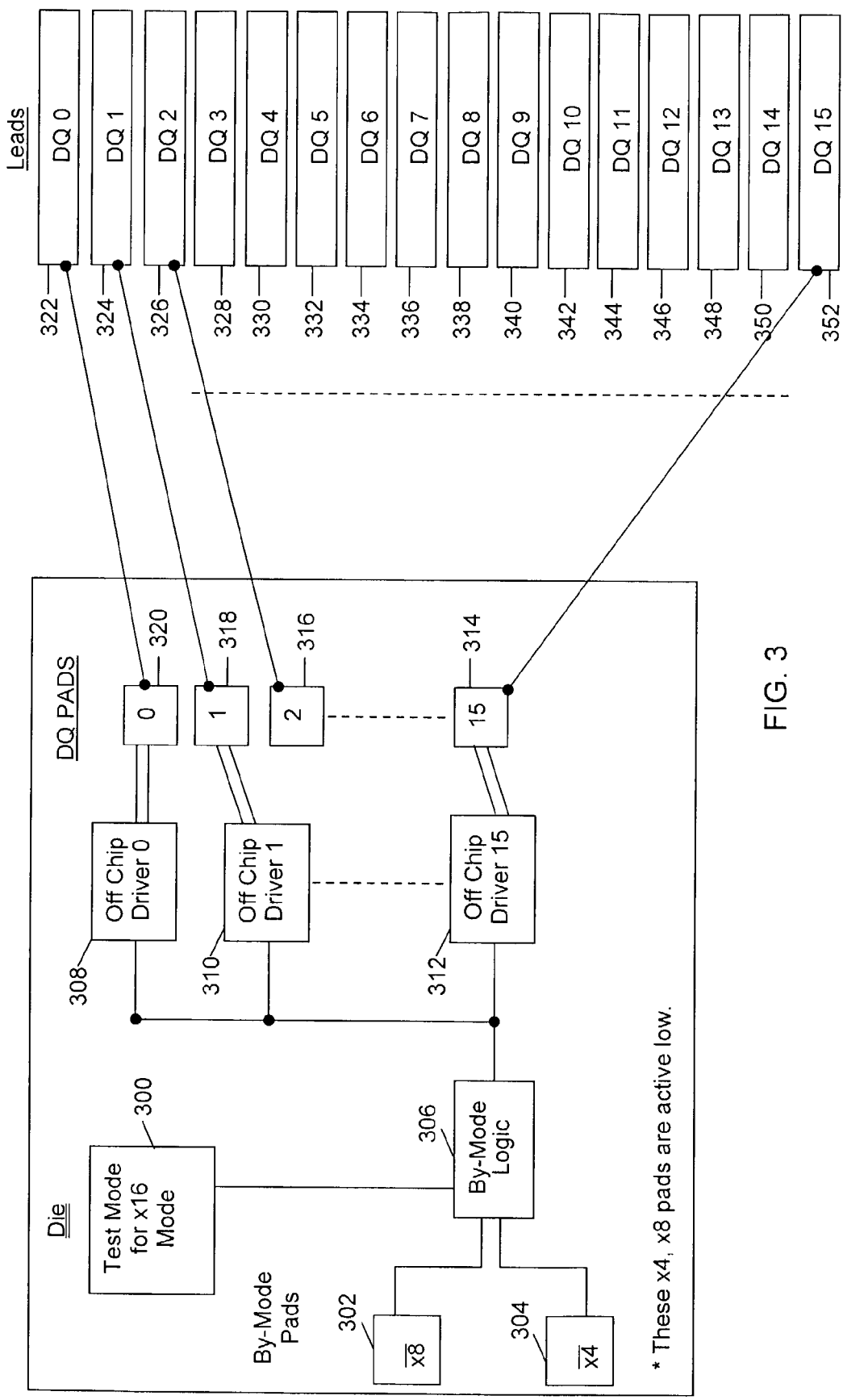
FIG. 3 is a block diagram of the preferred embodiment of FIG. 1.

FIG. 3 is a block diagram of the preferred memory die. As shown, the preferred die includes 16 DQ pads 314-320 attached to the inner leads 322-352 by a bonding process. To simplify the illustration, only some of the wire bonds, DQ pads, and off-chip drivers are shown. In this preferred embodiment, a wire bond preferably connects each inner electrical lead 322-352 to a separate DQ pad. Preferably, each of the DQ pads 314-320 is connected to an off-chip driver 308-312 by a conducting material. Preferably, the off-chip drivers 308-312 operate as selection gates which provide test access to each of the input/output paths of the die during testing. In this preferred embodiment, the off-chip drivers 308-312 can also drive the electrical leads 322-352 to a logic high, logic low, or a high impedance state.

Preferably, a tri-state by-mode logic 306 is connected to each of the off-chip drivers 314-320. The preferred by-mode logic 306 can select a circuit configuration based on the by four 304, by eight 302, and by sixteen 300 circuits formed in the die of the integrated memory 100. During component testing, the outputs of the by four and by eight circuits 302 and 304 are driven high, which puts the preferred integrated memory 100 into a test mode. In test mode, the widest input/output configuration is selected, which in this exemplary embodiment is a by sixteen configuration.

As shown in FIG. 4, a maximum input/output configuration occurs when the by-mode logic 306 receives a high-test mode signal ('TM') or high output signals from the by four and by eight circuits 302 and 304. When outputs from the by four and by eight circuits 302 and 304 are driven high concurrently, the preferred integrated memory 100 is in its operating architecture. This architecture does not change when a test occurs. However, when the test mode circuit 300 (shown in FIG. 3) drives an input of the by-mode logic 306 high, an operational by four or by eight architecture are modified into a by sixteen architecture. Preferably, a by sixteen architecture provides a maximum input/output access to the preferred integrated memory 100.

As further shown in FIG. 4, the test mode flow begins when the integrated circuit ('IC') is powered up at 405. Preferably, test mode selection occurs at 420. As shown in the adjacent dialog box, when the test mode output is at logic low, the preferred memory is configured in its operating architecture. When the test mode is at logic high, the preferred memory is configured to its widest input/output configuration. At 425, the test commences.

The above-described embodiments are not limited to the exemplary memory configurations described above. The preferred system and method can be implemented in standard or customized memory configurations. In a memory comprising a 'by x' configuration, preferably the test architecture comprises a 'by y' configuration where 'y' is an integer greater than 'x'. Alternatively, 'y' is an integer greater than or equal to 'x'.

Preferably, each of the input/output paths is coupled to electrical leads. Furthermore, the above-described flow diagram need not include all of the above-described acts. Many acts of the testing process can be excluded in alternative preferred embodiments, including but not limited to the dicing of the wafers and the operating configuration tests at 216, 228, and/or 236.

From the forgoing detailed description, it should be apparent that the presently preferred system and method could be a part of any electronic circuit and are not limited to integrated memories. Moreover, the presently preferred embodiments may also be scaled so that a maximum input/output configuration is not always attained. In these preferred alternative embodiments, the preferred system and method preferably increases input/output access of the semiconductor-based device from its normal operating architecture.

Many other alternatives are also possible. For example, the off-chip drives 308-312, by-mode logic 306, the by four and by eight circuits 302 and 304, and test mode control block 300 discussed above may individually or collectively can be off die components that interface the preferred memory 100. Furthermore, this operational logic associated with the off-chip drivers 308-312 can be implemented though software. In some preferred embodiments, the logic is active high. Of course, the preferred memory can also be formed with other types of control logic.

While various embodiments of the invention have been described, it will be apparent to those of ordinary skill in the art that many more embodiments and implementations are possible that are within the scope of this invention. Accordingly, the invention is not to be restricted except in light of the attached claims and their equivalents.

We claim:

1. A method of selecting a configuration for testing, comprising:
    establishing an operating architecture of a die by bonding selected data input/output pads of the die to separate electrical leads;
    establishing a test architecture of the die by bonding the remaining data input/output pads of the die to separate electrical leads, wherein in the test architecture, more data input/output pads of the die are used than in the operating architecture, such that, in the test architecture, more parallel input/output data paths are used than in the operating architecture;
    selecting the test architecture; and
    testing the die.

2. The method of claim 1 wherein an input/output pin is bonded by a wire bond.

3. The method of claim 1 wherein the integrated circuit is tested in the operating architecture.

4. The method of claim 3 wherein the integrated circuit is tested in the test architecture.

5. The method of claim 1 wherein the integrated circuit is tested in the test architecture.

6. The method of claim 1 wherein the integrated circuit is an integrated memory.

7. A method of reducing memory test times, comprising:
    configuring a memory on a die to an operating architecture of the memory by bonding selected input/output pads of the memory to external leads;
    configuring the memory to a test architecture of the memory by bonding selected data input/output pads of the memory to external leads, which include additional data input/output pads when compared to those bonded to configure the memory to the operating architecture, wherein, in the test architecture, more data input/output pads of the die are used than in the operating architecture, such that, in the test architecture, more parallel input/output data oaths are used than in the operating architecture;
    testing the memory in a test architecture; and
    testing the memory in an operating architecture.

8. The method of claim 7 wherein the bonds comprise DQ bonds.

9. The method of claim 7 wherein the device comprises an integrated memory.

10. A method of switching a memory on a die from a test mode to an operating mode, comprising:
    bonding each data input/output path of the memory to an external lead to configure the memory into a test architecture;
    programming the memory to operate in a test and an operating mode; and
    switching the memory from the test mode to the operating mode using a triggering logic that modifies input/output access to the memory, wherein, in the test mode, more data input/output paths of the die are used than in the operating mode, such that, in the test architecture, more parallel input/output data paths are used than in the operating mode.

11. The method of claim 10 wherein triggering logic applies a logic level to a selection circuit.

12. The method of claim 10 wherein triggering logic disables selected external leads during the operating mode.

13. A memory on a die comprising:
selection circuitry;
a plurality of data input/output pads coupled to the selection circuitry; and
a plurality of leads, each of the leads being coupled to one of the plurality of data input/output pads;
wherein selected leads provide access to data input/output paths of the memory only when the memory is in a test mode, so that, in the test mode, more data input/output pads of the die are used than in an operating architecture of the memory, such that, in the test mode, more parallel input/output data paths are used than in the operating architecture.

14. The memory of claim 13 wherein the selection circuitry comprises a by-mode logic coupled to an off-chip driver formed in a die.

15. The memory of claim 14 wherein the selection circuitry further comprises a test mode circuit coupled to the by-mode logic.

16. The memory of claim 14 wherein the selection circuitry is configured to enable a test architecture of the memory by Increasing input/output access to storage cells in the memory.

17. The memory of claim 14 wherein an operating architecture of the memory comprises a by 4 configuration, and a test architecture comprises a by 16 architecture.

18. The memory of claim 14 wherein an operating architecture of the memory comprises a by 8 configuration, and a test architecture of the memory comprises a by 16 architecture.

19. The memory of claim 14 wherein each of the input/output paths provide access to storage cells in the memory when the memory is in the test mode.

20. The memory of claim 13 wherein the memory can be configured into a test architecture and an operating architecture.

21. The memory of claim 13 wherein the operating architecture of the memory comprises a 'by x' configuration and a test architecture of the memory comprises a 'by y' configuration, wherein 'y' is greater than 'x.'

22. The memory of claim 13 wherein the operating architecture of the memory comprises a 'by x' configuration and a test architecture of the memory comprises a 'by y' configuration, wherein 'y' is greater than or equal to 'x.'

* * * * *

UNITED STATES PATENT AND TRADEMARK OFFICE
CERTIFICATE OF CORRECTION

PATENT NO.         : 7,305,594 B2
APPLICATION NO.    : 10/303179
DATED              : December 4, 2007
INVENTOR(S)        : James J. Dietz et al.

It is certified that error appears in the above-identified patent and that said Letters Patent is hereby corrected as shown below:

Column 4, in claim 7, line 13, after "input/output data" delete "oaths" and substitute --paths-- in its place.

Column 5, in claim 16, line 3, after "memory by" delete "Increasing" and substitute --increasing-- in its place.

Signed and Sealed this

Twenty-seventh Day of May, 2008

JON W. DUDAS
*Director of the United States Patent and Trademark Office*